US008614871B2

(12) United States Patent
Takeda

(10) Patent No.: US 8,614,871 B2
(45) Date of Patent: Dec. 24, 2013

(54) BATTERY SYSTEM

(75) Inventor: Kenji Takeda, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/414,983

(22) Filed: Mar. 8, 2012

(65) Prior Publication Data

US 2013/0033793 A1 Feb. 7, 2013

(30) Foreign Application Priority Data

Aug. 3, 2011 (JP) ................... 2011-169740

(51) Int. Cl.
*H02H 3/20* (2006.01)
*H02H 9/04* (2006.01)
*H02J 7/04* (2006.01)

(52) U.S. Cl.
USPC ......................... 361/91.4; 320/126

(58) Field of Classification Search
USPC .................... 320/122, 126; 361/91.4
See application file for complete search history.

(56) References Cited

U.S. PATENT DOCUMENTS

| 6,977,480 | B2 * | 12/2005 | Emori et al. | 320/104 |
| 7,400,113 | B2 * | 7/2008 | Osborne | 320/118 |
| 2010/0134069 | A1 * | 6/2010 | Oosawa et al. | 320/118 |

FOREIGN PATENT DOCUMENTS

| JP | 2003-244854 A | 8/2003 |
| WO | WO 2009/044511 A1 | 4/2009 |

OTHER PUBLICATIONS

English Translation of Japanese Office Action Dated Jun. 18, 2013 {3 Pages}.

* cited by examiner

*Primary Examiner* — Dharti Patel
(74) *Attorney, Agent, or Firm* — Crowell & Moring LLP

(57) ABSTRACT

A battery system is disclosed which includes: first and second battery blocks connected in parallel, each including a plurality of batteries connected in series; a battery state detector detecting voltages of the batteries in either of the second battery blocks. The number of the batteries in the second battery block is smaller than that of the first battery block. The battery state detector is installed integral with the second battery block.

2 Claims, 7 Drawing Sheets

BATTERY SYSTEM

CROSS REFERENCE TO RELATED APPLICATION

This application claims the foreign priority benefit under Title 35, United States Code, §119(a)-(d) of Japanese Patent Application No. 2011-169740, filed on Aug. 3, 2011 in the Japan Patent Office, the disclosure of which is herein incorporated by reference in its entirety.

BACKGROUND OF THE INVENTION

1. Field of the Invention

The present invention relates to a battery system and particularly to a battery system including a plurality of cells with a series-parallel connection.

2. Description of the Related Art

Battery systems are known which include a plurality of battery elements connected in parallel, each of the battery elements including cells (battery cells) connected in series.

JP 2003-244854 A discloses the battery system providing a high storage capacity in a whole of a power storage system by connecting a plurality of storage devices in parallel, each of the storage devices including a plurality of module batteries connected in series, each of the module batteries including a plurality of battery cells directly connected in series. In addition, each storage device includes a voltage sensor for detecting a cell voltage of each cell, a voltage sensor for detecting a voltage across terminals in the whole of the storage device, and a current sensor for detecting a current flowing through the storage device, etc. to increase a reliability and safeness of the storage device.

As a scale of the storage devices become large, a total number of the cells included in the storage device becomes very large. Accordingly, when a cell voltage of each cell is detected, there are difficulties in processing data and cost because the number of the voltage detectors and an amount of the detection voltage data become very large. In such a circumstance, it is desired to provide a battery system in which the number of voltage detecting points for the cells is reduced as possible as reliability and safeness of the storage device are kept.

However, it is difficult to reduce the number of voltage detection points for the cells because the conventional art aimed such an operation that states of cells forming the storage device are homogenized.

SUMMARY OF THE INVENTION

An aspect of the present invention provides a battery system wherein the number of voltage detecting points in the battery cells can be decreased as possible as safeness is kept.

An aspect of the present invention provides a battery system comprising:

a first battery block including a plurality of batteries connected in series;

a second battery block including a plurality of batteries connected in series;

a battery state detector configured to detect voltages of the batteries second battery block, wherein the first and second battery blocks are electrically connected in parallel, wherein the number of the batteries in the second battery block is smaller than that of the first battery block, and wherein the battery state detector is installed integral with the second battery block.

According to the present invention, a battery system is provided in which the number of components for voltage detection for the cells can be decreased as possible as safeness is kept.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

With reference to drawings will be described battery systems according to the present invention.

Figure 1:
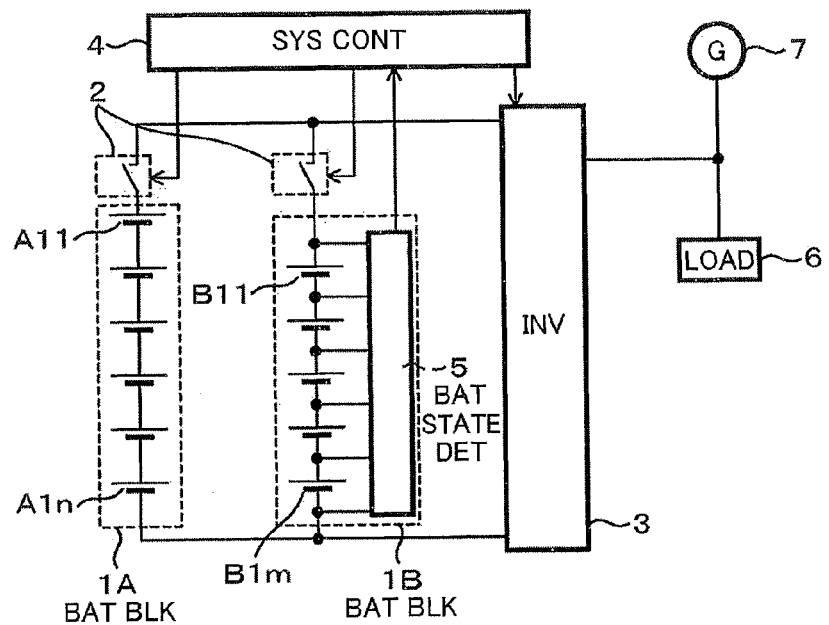
FIG. 1 is a block diagram of a battery system according to a first embodiment of the present invention.

FIG. 1 shows a battery system according to the first embodiment of the present invention. FIG. 1 is a block diagram of the battery system of the present invention. The battery system according to the present invention includes a battery block 1A including a plurality of batteries A11 to A1$n$ connected in series and a battery block 1B including batteries B11 to B1$m$ connected in series (m and are natural numbers more than one). The batteries A11 to A1$n$ and B11 to B1$m$ in each battery block may be formed with a cell or a plurality of cells connected with a series-parallel connection. The battery blocks are formed using cells having approximately homogenized characteristics by using cells manufactured in the same shape as the same model. The same cells are all used for forming the battery blocks 1A and 1B to improve easiness in assembling.

Because the battery blocks 1A and 1B are formed by connecting cells in series therein, each of the battery blocks 1A and 1B generates at both terminals a total voltage, as an electromotive force, which is approximately the number of times a cell voltage. To the terminal outputting the total voltage in each of the battery blocks 1A and 1B, switches 2 are electrically connected. The battery blocks 1A and 1B are connected in parallel through the switches 2. Connected to the joint for the parallel connection between the battery blocks 1A and 1B is a DC circuit part of an inverter 3. The inverter 3 has a function of conversion between an AC power and a DC power to provide charging and discharging power for the battery blocks 1A and 1B when the switches 2 are turned on. The inverter 3 can be connected, at an AC side thereof, to a grid 7 or an electric load 6. A discharged power from the battery blocks 1A and 1B can be used as a regenerated power to the grid 7 or consumed in the electric load 6. A charging power to the battery blocks 1A and 1B can be supplied with a power from the grid 7.

Figure 2:
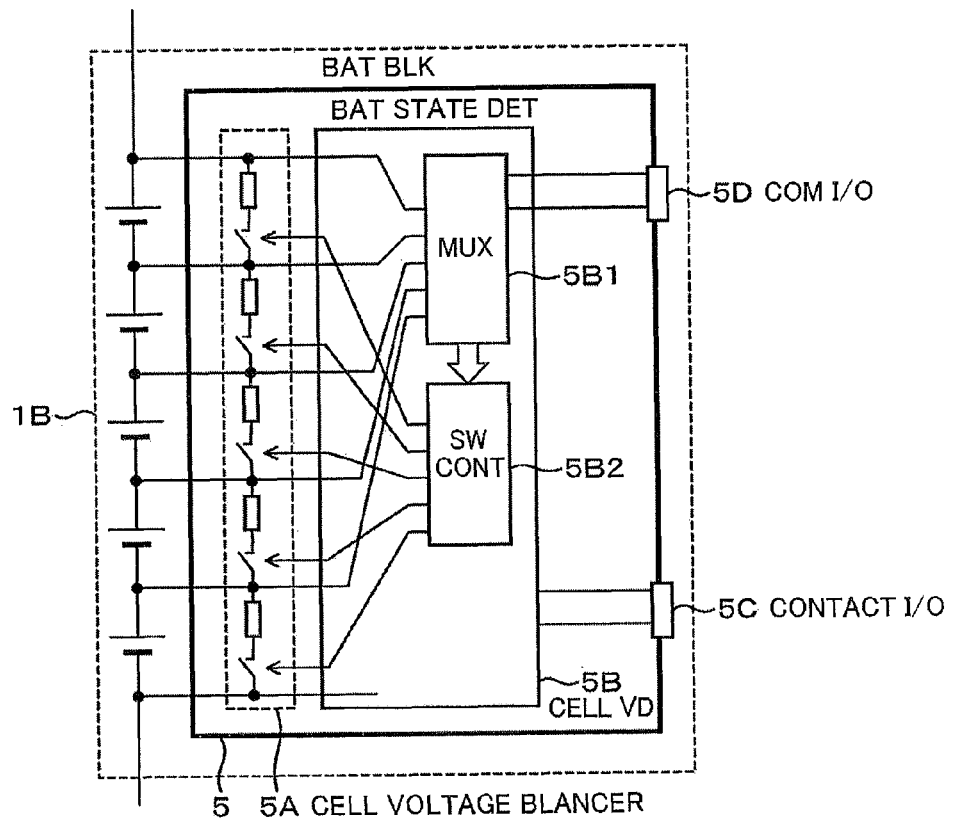
FIG. 2 is a block diagram of a battery block 1B shown in FIG. 1.

In addition, the battery block 1B is provided (installed integral) with a battery state detector 5. FIG. 2 shows a block diagram of the battery state detector 5. The battery state detector 5 includes a cell voltage balancer 5A, a cell voltage detector 5B, a contact input output unit 5C, and a communication input and output unit 5D.

The cell voltage balancer 5A may have such a configuration that a series circuit of a resistor and a switch is connected to both terminals of each of batteries $B11$ to $B1m$. A switch controller 5B2 controls the switches in the cell voltage balancer 5A.

A cell voltage detector 5B1 may be formed with a multiplexer for multiplexing, i.e., switching, a plurality of inputs to output a multiplexed signal, an A/D converter for converging an analog signal to a digital signal, a communication circuit for outputting a digital value externally. Both terminals of each of batteries $B11$ to $B1m$ are connected to a cell voltage detector 5B1 in order that voltages of the batteries $B11$ to $B1m$ are read out as digital values.

The cell voltage balancer 5A balances voltages of the batteries $B11$ to $B1m$ by consuming electric charges in the batteries in the resistors by turning on a switch installed inside the cell voltage balancer 5A, the switch corresponding to the battery having a higher voltage among the batteries $B11$ to $B1m$.

The communication input and output unit 5D is provided to output the digital values obtained from the multiplexer 5B1 to the external (the system controller 4) and may have additional functions such as isolation of the digital signal or level conversion of the digital signal.

A contact input-output unit 5C is a contact signal generating unit for receiving and outputting states of the battery state detector 5 such as startup/stop and normal/abnormal and may have a signal conversion function similarly to the communication input and output unit 5D.

The battery system according to the present invention includes a system controller 4. The system controller 4 may perform an open/close operation for the switch 2 and charging and discharging control operations for the inverter 3.

Figure 3A:
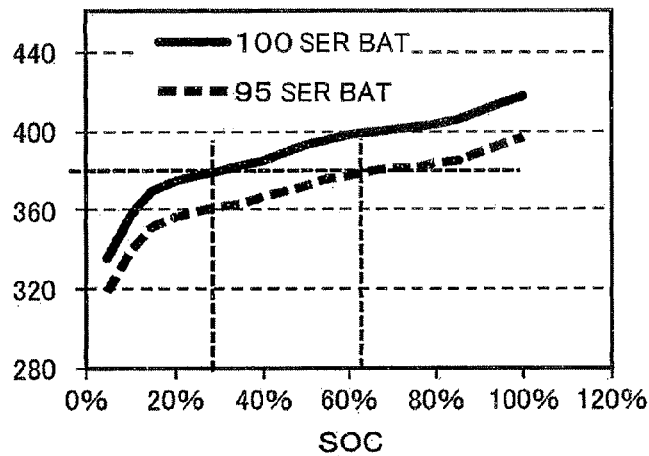
FIG. 3A is a chart illustrating a variation of state of charge (SOC) when battery blocks connected in parallel, the battery blocks respectively having a different number of batteries connected in series.
Figure 3B:
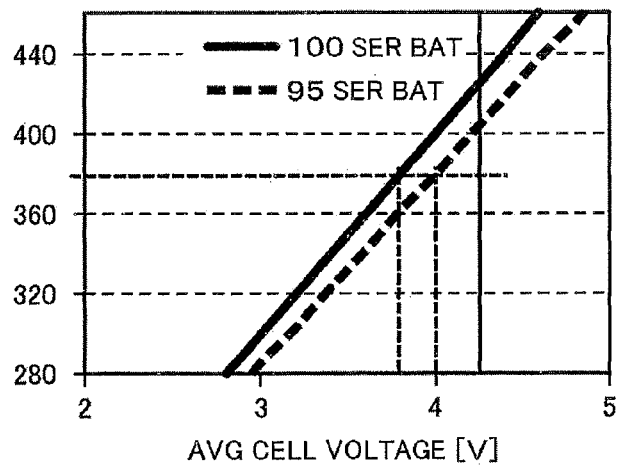
FIG. 3B is a chart illustrating a variation of an average battery voltage (V) when battery blocks connected in parallel, the battery blocks respectively having the different number of batteries connected in series.

As described above, the battery blocks 1A and 1B are configured with a different number of battery cells connected in series. FIGS. 3A and 3B show variations of the total voltage during charging when the battery blocks are configured with a different number of single batteries connected in series. FIG. 3A shows voltage potential differences across both terminals of the battery blocks 1A and 1B in which an abscissa represents a state of charge (SOC) of batteries, and an ordinate represents the number of batteries connected in series. For example, if it is assumed that the battery blocks are charged with a voltage potential difference across both terminals at 380 V, and that a sufficient time elapsed after start of parallel-connection charging of a battery block having 95 batteries connected in series and another battery block having 100 batteries connected in series, the SOC respectively reaches equilibrium at approximately 63% and 28%. If the batteries are of general type, it is known that the voltage difference across both terminals has a monotonically increasing characteristic against the SOC, and thus the SOC generally becomes smaller in the battery block having a larger number of the batteries connected in series than the battery block having a smaller number of the batteries connected in series.

FIG. 3B shows total voltages of the battery blocks in which an abscissa represents an average cell voltage, and an ordinate represent a total voltages when the number of batteries connected in series is changed. For example, when sufficient time elapsed after a battery block including 95 batteries connected in series and a battery block including 100 batteries connected in series are connected in parallel, average cell voltages respectively become 4.0 V and 3.8 V. Because the total voltage of the battery block is proportional to the number of the batteries connected in series in the battery block, the average cell voltage becomes smaller in the battery block having more batteries than the battery block having fewer batteries.

Generally, when a voltage higher than a predetermined limit voltage is generated, it is known that an irreversible abnormality occurs in the battery. For example, in lithium ion batteries, there may be a limit voltage at about 4.2 V regarding a physical property change in battery composition material. When influence of the number of the batteries on the limit voltage is considered, in the state where the total voltage is 380 V as shown in FIG. 3B, a cell voltage in the battery block having 100 batteries connected in series becomes lower than the battery block having 95 batteries connected in series. Accordingly it can be understood that a voltage margin becomes approximately doubled against the limit voltage.

As described above, it can be understood that when the battery blocks having different number of batteries connected in series are connected in parallel, the battery block having a more batteries can be operated more safely than the battery block having a fewer batteries because a voltage margin become larger against the voltage limit in the battery block having more batteries. In the conventional art, all voltages of single cells forming the battery block are monitored by detector using an A/D converter technology, and determination is made against the limit voltage. On the other hand, in the present invention, points or times of the battery voltage detection can be reduced because the voltage margin increases in the battery block 1A having the number of batteries connected in series which is higher. On the other hand, in the battery block 1B having a fewer batteries, the voltage margin does not change, so that it is desirable to monitor the voltage of each of the batteries by a voltage detection function built in the battery state detector 5.

Figure 4:
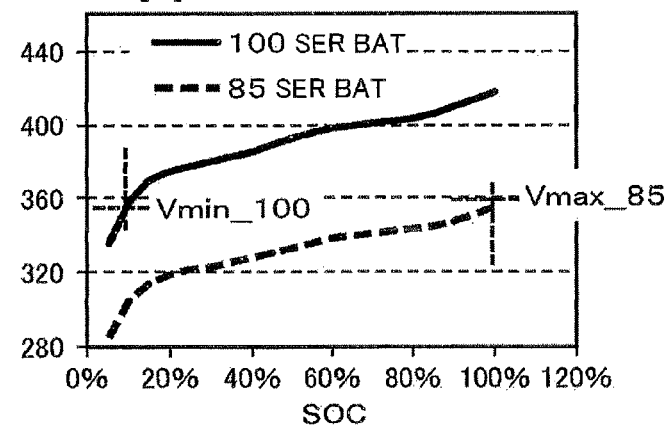
FIG. 4 is a chart illustrating a variation of state of charge (SOC) when battery blocks connected in parallel, the battery block 1A having 100 batteries connected in series and the battery block 1B having 85 batteries connected in series.

In FIG. 4, an abscissa represents the state of charge (SOC) of the battery and the ordinates represents voltage potential differences between both terminals of the battery blocks, when the number of the batteries connected in series is changed. The number of the batteries connected in series is 100 in the battery block 1A and 85 in the battery block 1B. As shown in FIG. 4, when the battery blocks having a different number of batteries connected in series, because it is necessary to control the total voltage to a similar level when a range of the SOC of the used batteries is predetermined, the number of the batteries connected in series is to be selected in accordance with the following equation.

$$n \times V \text{ (minimum SOC)} < m \times V \text{ (maximum SOC)}$$

When the grid connected to the inverter 3 is of a low voltage AC power, it is better to determine the voltage for the battery blocks from DC 300 V to DC 600 V because it is known that voltage converting units such as a transformer, a chopper circuit, can be omitted from the power converter including the inverter 3 for a simplified configuration.

Accordingly, for example, when lithium ion batteries having characteristic as shown in FIG. 3B are used and the battery is configured with cells, it is sufficient to select n and m such that the above equation is satisfied within a range of m>85, n<143.

Figure 5:
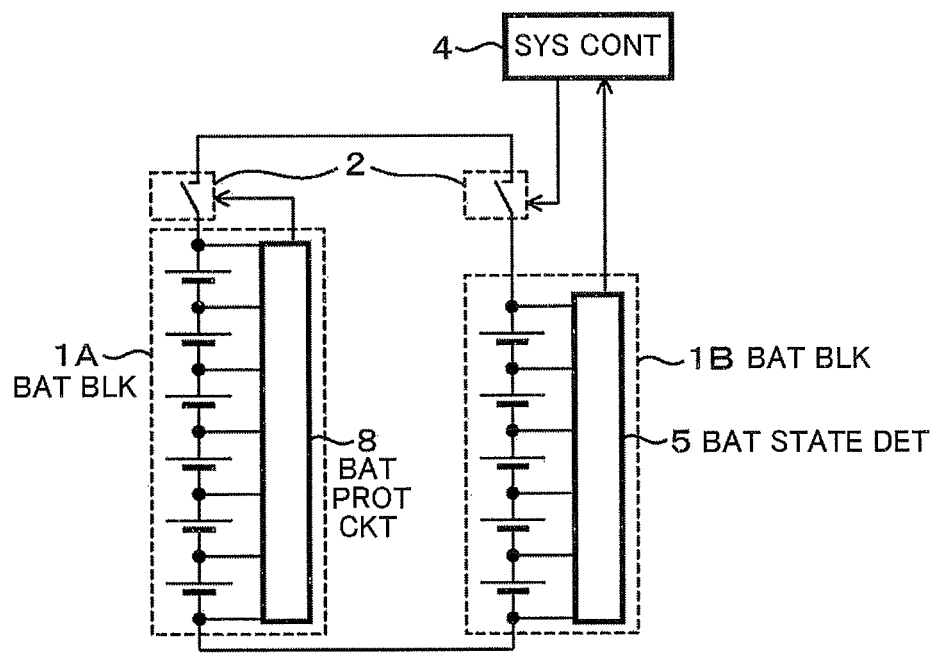
FIG. 5 is a block diagram of a battery system according to a second embodiment of the present invention.
Figure 6:
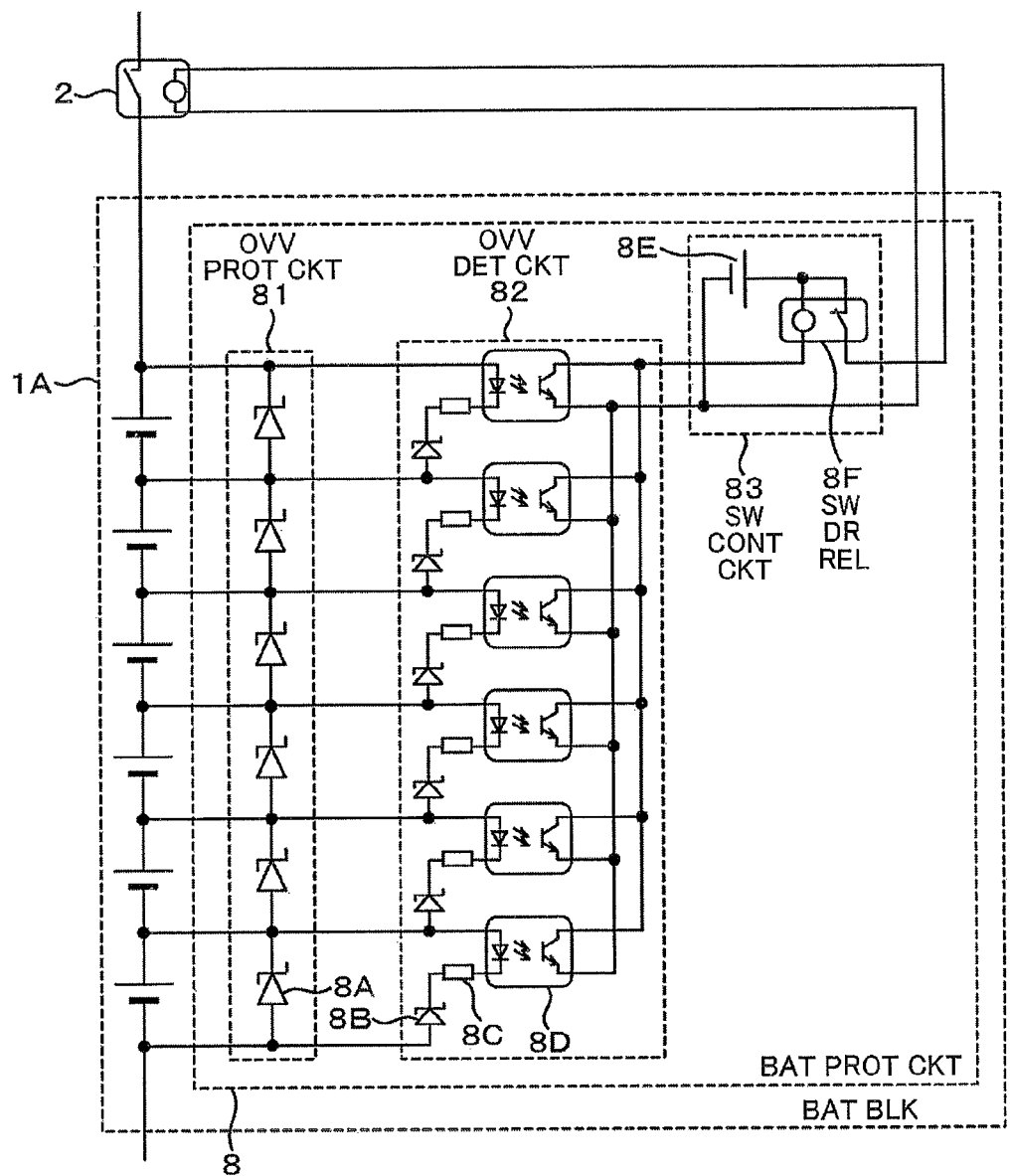
FIG. 6 is a block diagram of a battery block 1A according to the second embodiment.

FIG. 5 shows a second embodiment of the present invention. The second embodiment is different from the first embodiment in that a battery protection circuit 8 is included in (installed integral with) the battery block 1A. In addition, the switch 2 connected to the battery block 1A is configured to be controlled by the battery protection circuit 8. FIG. 6 shows the battery protection circuit 8 in detail.

The battery protection circuit 8 includes an overvoltage protection circuit 81, an overvoltage detector 82, and a switch controller 83.

For example, the overvoltage protection circuit 81 includes Zener diodes 8A, each of which cathode is connected to a positive terminal of corresponding one of the batteries A11 to A1n and each of which anode is connected to the negative terminals of the corresponding one of the batteries A11 to A1n. A breakdown voltage of the Zener diode (Zener voltage) may be selected, for example, from 4.0 to 5.0 V for the lithium ion battery. Accordingly, though there is abnormality in either cell in the battery block 1A, the overvoltage protection circuit 81 keeps safeness in each battery.

The overvoltage detector 82 includes overvoltage detection circuits, each including a Zener diode 8B, a resistor 8C, and a photocoupler 8D. A light-emitting side of the photo coupler 8D is connected to a series circuit of the resistor 8C and a Zener diode 8b connected in series. This series circuit is connected between positive and negative terminals of each of the batteries A11 to A1n. The light-emitting may be performed only when the Zener diode 8B becomes breakdown. Each of the detection elements (Zener diode 8B, resistor 8C, photocoupler 8D) is connected to each of the batteries in the first battery block in parallel. In this configuration, the photo-receiving sides corresponding to all Zener diodes 8C connected to the batteries A11 to A1n may be connected to have an OR connection.

A switch control circuit 83 is configured to make the switch open when the photocoupler 8D emits in the overvoltage detection circuit 82 using a voltage source 8E and a switch drive relay 8F. The switch drive relay 8F is selected in accordance with a drive signal for the switch 2. In addition, when a breakdown voltage of the Zener diode 8A is set to be lower than that of the Zener diode 8B, even if one of batteries becomes an overvoltage, the corresponding Zener diode 8A breaks down, so that the voltages of the battery and adjoining battery are balanced. This configuration prevents the switch 2 from being in an open state except that the state becomes really abnormal. This can reduce influence by the open state of the switch 2 on the inverter 3, etc.

When the overvoltage protection circuit 81 is installed in the battery block 1A, the number of components becomes larger than that of the first embodiment. However, the number of components is still kept lower than the case where the battery state detector 5 is installed in the battery blocks 1A and 1B, so that a battery system can be provided more safely at a low cost. In addition, the overvoltage protection circuit 81 is installed in the battery block 1A instead of the battery state detector 5, reducing a data amount in the whole of the system, which allows a low cost of controller to be used as the system controller 4.

Figure 7:
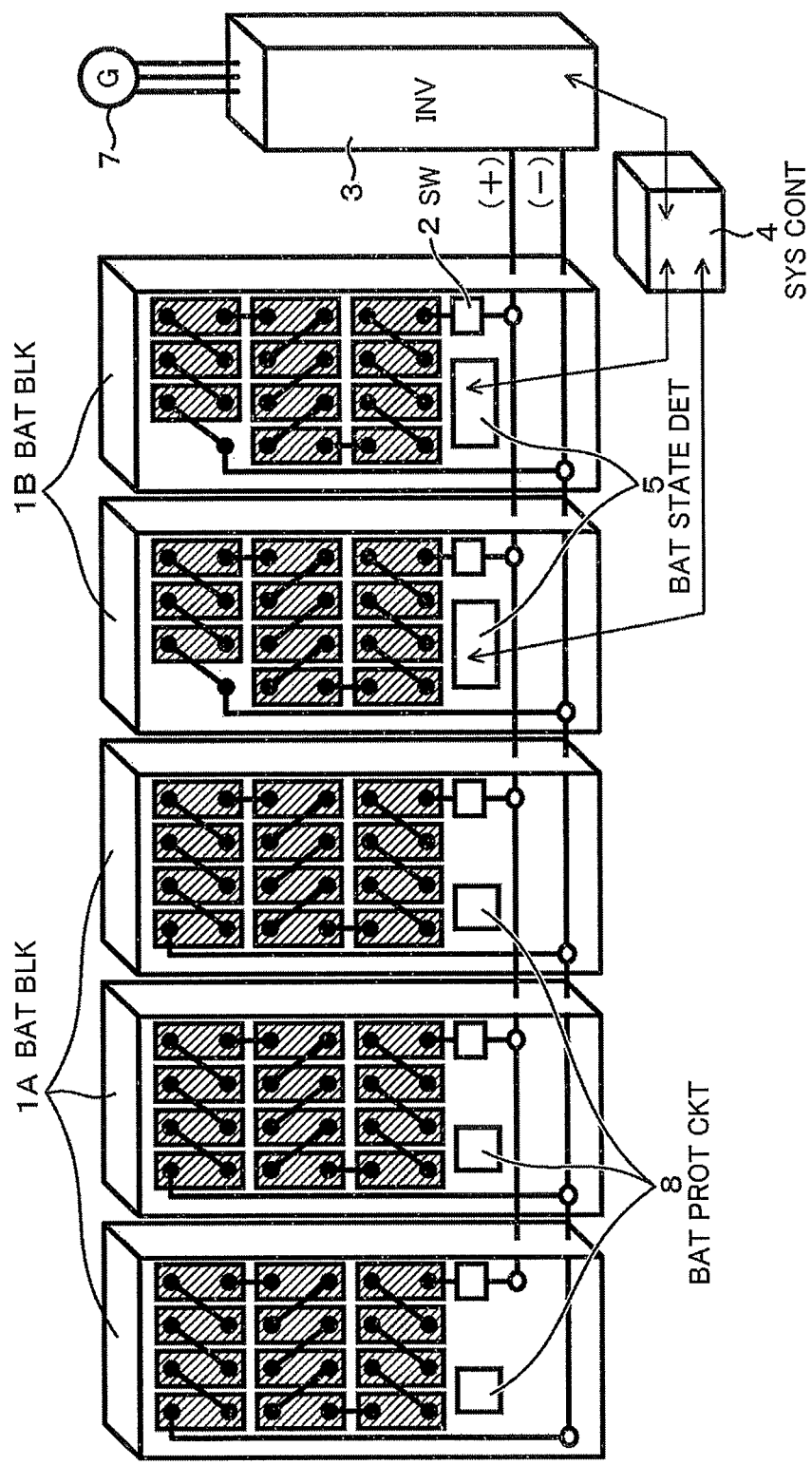
FIG. 7 is a block diagram of a battery system according to a third embodiment of the present invention.

FIG. 7 shows a battery system according to a third embodiment. In the battery system according to the third embodiment, the battery blocks 1A and 1B are housed in enclosures using racks. The battery block 1B is housed in the enclosure such that the total number of the batteries is smaller than that of the battery block 1A. With such a configuration, because the battery blocks 1A and 1B are connected in parallel irrespective of difference in the total number of batteries in each of the blocks, a layout structure of the whole of the battery system can be made simpler. In addition, if the enclosures for the battery blocks 1A and 1B have the same sizes, because there will be a vacant space in the enclosure for the battery block 1B having a fewer batteries, the battery state detector 5 can be installed in the enclosure to effectively use the space, resulting in down-sizing the system.

In the configuration, because the battery blocks 1A and 1B are installed and connected on a DC side of the inverter 3 at unit of enclosure, the battery blocks 1A and 1B can be replaced with another set of battery blocks only by replacing the enclosures with other enclosures, which increase a degree of freedom in arrangement and a workability.

In the battery block 1B, because the battery block 1B has an SOC having a wider variation range than the battery block 1A, the battery block 1B tends to have a deterioration speed higher than the battery block 1B. Accordingly, the battery block 1B may be installed at a location which is easier in exchanging than the battery block 1B. For example, arranging the battery block 1B at a location near an inlet/outlet, a location easier for a crane, etc., to access there improves maintainability for the whole of the system. In addition, if it is possible to exchange the battery in the battery block 1B irrespective of the operation of the battery block 1A, this can reduce influence on the operation for the whole of the system by the exchanging process.

Figure 8:
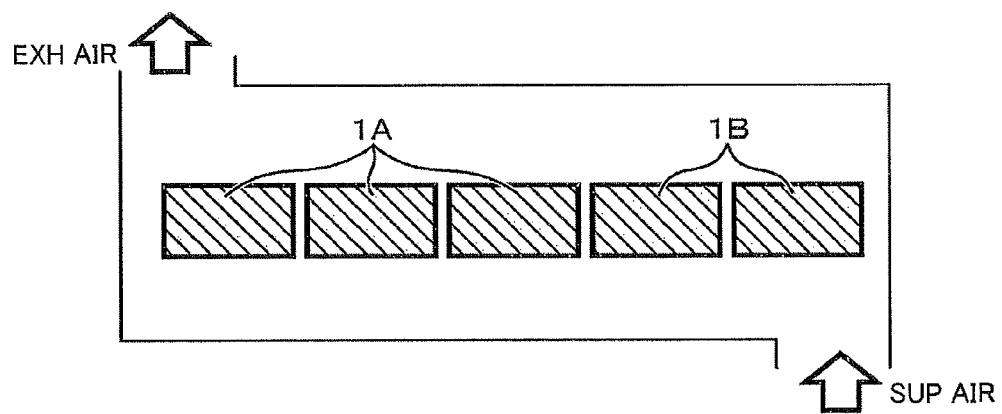
FIG. 8 is an illustration showing a specific arrangement of the battery system according to the third embodiment.

In addition, the battery block 1B has a tendency to have a resistance in series connection than the battery block 1A because the number of the cells connected in series in the battery block. In this case, because the battery blocks 1A and 1B are connected in parallel, the battery block 1B allows a current to flow therethrough at a larger current than the battery block 1A, so that a loss generated in the battery block 1B becomes larger than the battery block 1A. Arranging the battery block 1B at a location suitable for being cooled enable to control the battery temperature of the whole of the system uniformly, which makes it easier to handle the batteries and longer to expand the life of the batteries. For example, as shown in FIG. 8, the battery block 1B may be arranged at a location near an air conditioner, or upstream of cooling air flow around the battery block.

As described above, the battery blocks 1A and 1B are housed in separate enclosures, so that a degree of freedom in arrangement of components in the battery system is increased. Particularly the battery block 1B can be disposed at a location more suitable for cooling which will result in an extended life time of the battery system.

Figure 9:
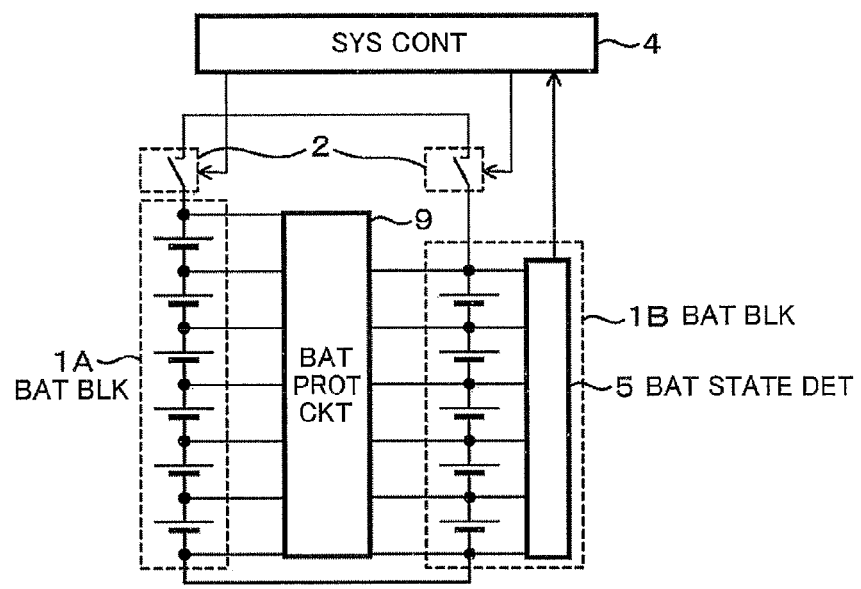
FIG. 9 is a block diagram of a battery system according to a fourth embodiment of the present invention.
Figure 10:
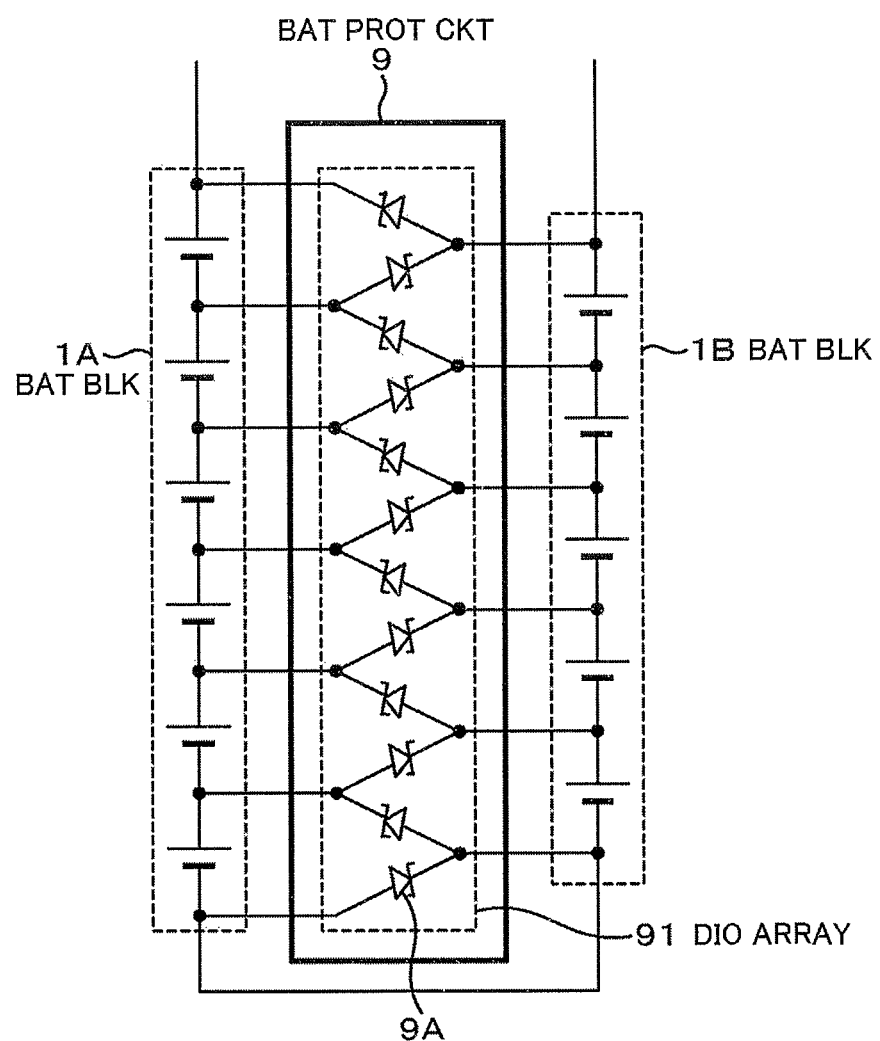
FIG. 10 is a circuit diagram of a battery protection circuit 9 according to the fourth embodiment.

FIG. 9 shows a fourth embodiment of the present invention. FIG. 9 is different from FIG. 5 in that a second battery protection circuit 9 is installed which is electrically connected to both the battery blocks 1A and 1B. FIG. 10 is a circuit diagram of the second battery protection circuit 9.

In FIG. 10, the second battery protection circuit 9 has a diode array 91 including a plurality of Zener diodes 9A which is connected in series with such a zigzag connection that one of the terminals of the batteries A11 to A1n of the battery block A1 is connected through one of the Zener diodes 9A to one of the terminals of the batteries B11 to B1m of the battery block B1 which is connected to the next one of the terminals of the batteries A11 to A1n of the battery block A1 higher potential than the former one terminal, this connection being repeated to have a voltage potential increasing order at each of connected terminals with reference to a reference potential at a parallel connection between both the battery blocks 1A and 1B (common potential with the lowest connection resistance).

In other words, one terminal of each of the Zener diodes connected to a terminal of one of batteries in the first battery block and another end is connected to a terminal of one of the batteries in the second battery block 1B.

In case of occurrence of overvoltage in either of the batteries A11 to A1n, B11 to B1m, the Zener diode 9A can suppress the overvoltage through the Zener diode 9A.

A specific Zener voltage Vz is approximately determined as follows:

$$Vz = Vlim - |Vs/n - Vs/m|$$

where Vlim is a battery overvoltage level such as 4.2 V and Vs is a supposed voltage across both terminals of the battery blocks 1A and 1B, and n and m are the number of the batteries in the battery blocks 1A and 1B.

The fourth embodiment can suppress the overvoltage at each cell in the battery blocks 1A and 1B with one circuit of the second battery protection circuit 9, so that the battery system can be further improved in safeness with a fewer number of components.

The invention claimed is:

1. A battery system comprising:
   a first battery block including a plurality of batteries connected in series;
   a second battery block including a plurality of batteries connected in series;
   a battery state detector configured to detect voltages of the batteries in the second battery block;
   a switch connected to the first battery block in series;
   a battery protection circuit, comprising detection circuits, configured to detect overvoltage in the batteries of the first battery block and make the switch open when the overvoltage is detected; and
   a switch controller configured to control open and close states of the switch on the basis of the signals from the detection circuits; wherein
   the first and second battery blocks are electrically connected in parallel,
   the number of the batteries in the second battery block is smaller than that of the first battery block,
   the battery state detector is installed integral with the second battery block,
   the protection circuit comprises an overvoltage protection circuit comprising Zener diodes which are respectively connected to the batteries of the first battery block, and
   each of the overvoltage detection circuits comprises a photocoupler, wherein the photocoupler transmits a control signal to the switch controller when the Zener diode breaks down.

2. The battery system as claimed in claim 1, further comprising an inverter configured to convert a DC power to an AC power, wherein positive terminal sides of the first and second battery blocks are connected to a positive terminal of the inverter, and wherein negative sides of the first and second battery blocks are connected to a negative terminal of the inverter.

* * * * *